United States Patent [19]
Klein et al.

[10] Patent No.: US 6,191,034 B1
[45] Date of Patent: Feb. 20, 2001

(54) FORMING MINIMAL SIZE SPACES IN INTEGRATED CIRCUIT CONDUCTIVE LINES

(75) Inventors: Richard K. Klein, Mountain View; Asim A. Selcuk, Cupertino; Nicholas J. Kepler, San Jose; Christopher A. Spence; Raymond T. Lee, both of Sunnyvale; John C. Holst, San Jose, all of CA (US); Stephen C. Horne, Austin, TX (US)

(73) Assignee: Advanced Micro Devices, Sunnyvale, CA (US)

( * ) Notice: Under 35 U.S.C. 154(b), the term of this patent shall be extended for 0 days.

(21) Appl. No.: 09/286,401

(22) Filed: Apr. 5, 1999

Related U.S. Application Data

(63) Continuation of application No. 08/986,179, filed on Dec. 5, 1997, now abandoned.
(60) Provisional application No. 60/048,180, filed on May 30, 1997.

(51) Int. Cl.[7] .................................................. H01L 21/44
(52) U.S. Cl. ..................... 438/669; 438/612; 438/637; 438/639; 438/670; 438/671; 438/673

(58) Field of Search ..................................... 438/639, 669, 438/670, 671, 673, 637, 612

(56) References Cited

U.S. PATENT DOCUMENTS

| 4,977,105 | * | 12/1990 | Okamoto et al. | 437/190 |
| 5,330,934 | * | 7/1994 | Shibata et al. | 437/195 |
| 5,491,103 | * | 2/1996 | Ahn et al. | 438/253 |
| 5,712,182 | * | 1/1998 | Madan | 438/253 |
| 5,712,202 | * | 1/1998 | Liaw et al. | 438/253 |
| 5,716,883 | * | 2/1998 | Tseng | 438/253 |
| 5,795,823 | * | 8/1998 | Avazino et al. | 438/639 |
| 5,846,873 | * | 12/1998 | Violette et al. | 438/585 |

* cited by examiner

Primary Examiner—John F. Niebling
Assistant Examiner—David A. Zarneke
(74) Attorney, Agent, or Firm—Foley & Lardner

(57) ABSTRACT

A method of forming minimal gaps or spaces in conductive lines pattern for increasing the density of integrated circuits by first forming an opening in an insulating layer overlying the conductive line by conventional optical lithography, followed by forming sidewalls in the opening to create a reduced opening, and using the sidewalls as a mask to remove, preferably by etching, a portion of the conductive line pattern substantially equal in size to the reduced opening.

12 Claims, 2 Drawing Sheets

FORMING MINIMAL SIZE SPACES IN INTEGRATED CIRCUIT CONDUCTIVE LINES

CROSS REFERENCE TO RELATED APPLICATION

This application is a con of U.S. patent application Ser. No. 08/986,179, entitled "Forming Minimal Size Spaces in Integrated Circuit Conductive Lines", filed Dec. 5, 1997 ABN, which claims benefit of provisional Appln 60/048,180 filed May 30, 1997.

FIELD OF THE INVENTION

The present invention relates to fabricating integrated circuits and, more specifically, to fabricating the conductive line levels of integrated circuits with minimal size spaces.

BACKGROUND OF THE INVENTION

With the demand for higher levels of integration of semiconductor chips, such as silicon semiconductor chips, and the need for greater density in these circuits, the conductive line dimensions and spaces between the conductive lines of the integrated circuits become more and more critical. This is especially the case with a microprocessor integrated circuit chip of which a large portion of the real estate of the chip is an SRAM. For increased performance of future microprocessors, the storage capacity of the SRAM must increase thereby requiring a larger portion of real estate of the microprocessor.

A limit on the dimensions in the integrated circuits is the resolution of the optical lithographic system used in the fabrication of the integrated circuit including the conductive line levels. Today, with deep ultra violet photolithography, the resolution limit is about 0.25 microns. To break through this barrier, semiconductor manufactures are resorting to techniques like phase shift lithography, which require expensive masks but permit optical lithography to achieve these small line widths, and X-ray lithography which is extremely costly from an exposure equipment and mask making standpoint. Electron beam is another exposure alternative to achieve line widths of less than 0.25 microns, but its throughput is extremely slow when it is used in a direct write mode.

Techniques are thus required to reduce the line widths without resorting to expensive masks or exposure equipment and permit the use of conventional optical lithography.

SUMMARY OF THE INVENTION

Accordingly, it is an object of the present invention to provide a method of fabricating an integrated circuit with minimal line widths with conventional optical lithography.

Another object of the present invention is to provide an integrated circuit fabrication method in which the gaps or spaces between conductive lines can be further reduced after being first defined by optical lithography.

A further object of the present invention is to provide a fabrication method of an integrated circuit which uses conventional semiconductor manufacturing apparatus.

In accordance with the present invention, a semiconductor material, such as a silicon wafer, is formed with a conductive line pattern, such as polysilicon, using conventional optical lithography. To form a gap or space in the conductive line pattern, an etch protective layer, such as silicon nitride, is preferably disposed on the conductive line pattern followed by an insulating layer, such as silicon oxide, disposed on the etch protective layer. Again using conventional optical lithography, a pattern opening is formed in the insulating layer and the preferable etch protective layer, by preferably exposure and development of an optical resist and anisotropic dry etching. With the opening formed in the insulating and etch protection layer, a layer of conformal material is deposited on insulating layer and on the walls of the insulating and etch protective layers. This conformal layer is anisotropically etched to create sidewalls in the opening with the gap or space between the sidewalls being the desired gap or space in the conductive line. Again using anisotropic dry etching with a gas having greater selectivity for the conductive line material than the conformal material, a gap or space is etched in conductive line which is two sidewall spacer widths less in dimension than the original opening, thereby being able to achieve a gap or space less than the resolution of the optical lithography.

BRIEF DESCRIPTION OF THE DRAWINGS

The foregoing and other objects, aspects and advantages will be better understood from the following detailed description of a preferred embodiments of the invention with reference in the drawings, in which.

DETAILED DESCRIPTION OF THE PREFERRED EMBODIMENTS OF THE INVENTION

Figure 1:
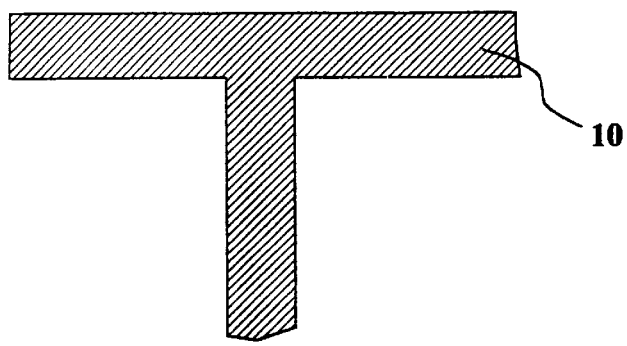
FIG. 1 is a plan view of a portion of a conductive line pattern.
Figure 2A:
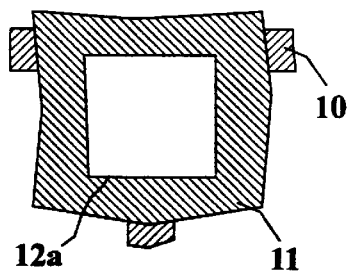
FIGS. 2a, 2b and 2c are plan views of the portion of conductive line pattern of FIG. 1 with an insulating layer thereon with optical lithographic openings of different shapes.
Figure 2B:
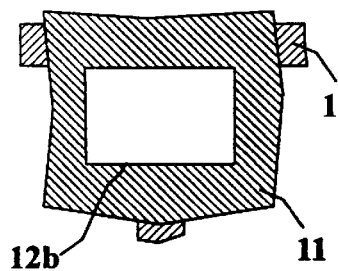
Figure 2C:
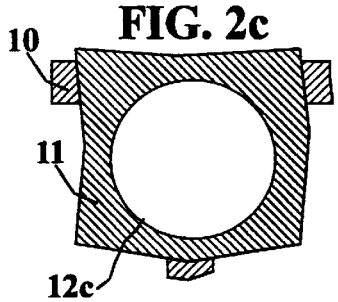
Figure 3A:
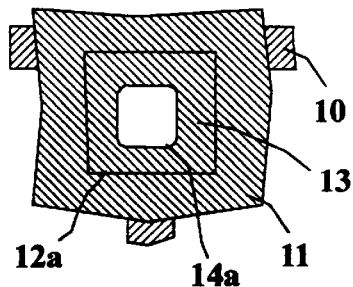
FIGS. 3a, 3b and 3c are plan views of the portion of the conductive line pattern with openings of FIGS. 2a, 2b and 2c surrounded by sidewalls of an etched conformal material and with a reduced opening between the sidewalls corresponding to the shape of the lithographic opening.
Figure 3B:
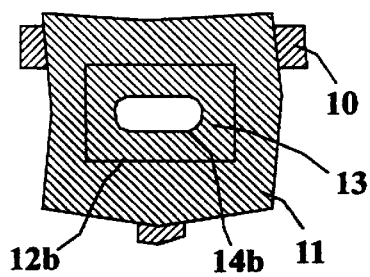
Figure 3C:
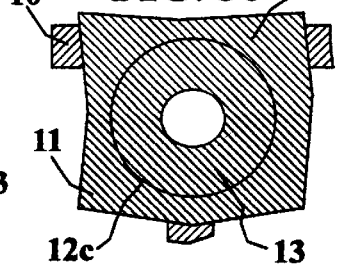
Figure 4A:
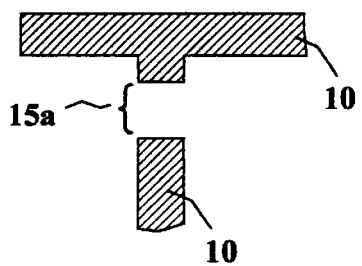
FIGS. 4a, 4b and 4c are plan views of the portion of the conductive line pattern with a gap or space in the conductive line pattern of the size of the reduced opening between the sidewalls corresponding to FIGS. 4a, 4b and 4c.
Figure 4B:
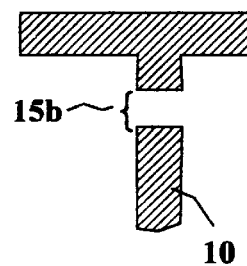
Figure 4C:
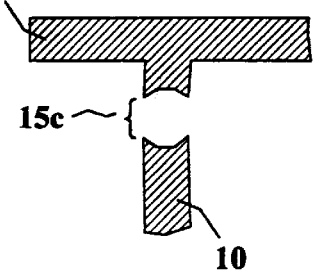

Referring now to the drawings and starting with FIG. 1, which shows a plan view of conductive line pattern 10, herein polysilicon doped with an impurity, such as arsenic or boron depending on the type of transistor with which the conductive line is associated. To form a minimal gap or space in the conductive line pattern, an insulating layer 11, herein silicon oxide is formed or deposited on the conductive line as shown in FIGS. 2a, 2b and 2c, preferably after first forming or depositing an etch protective layer (not shown) on the conductive line pattern 10. As shown in FIGS. 2a, 2b and 2c, three different shaped openings 12 are formed in the insulating layer 11 and, if present, in the etch protective layer, by conventional optical lithography with resist patterns defining the shape of the opening. A conformal material, herein tetraethylorthosilicate (TEOS), is deposited on the insulating layer 11 and in the openings 12a, 12b and 12c and is anisotropically etched to remove the conformal material on the surface of the insulating layer and at the bottom of the openings 12a, 12b and 12c, leaving sidewalls 13 in the opening as shown in FIGS. 3a, 3b and 3c. These sidewalls define reduced openings 14a, 14b and 14c and serve as a mask in forming a gap or space in the conductive line pattern 10 which preferably is anisotropically dry etched with a gas having greater selectivity for the conductive line material, herein polysilicon, than the insulating material of the sidewalls 13. With the insulating material and sidewalls removed, the conductive line pattern 10 is shown in FIG. 4a, 4b and 4c with a gap or space 15a, 15b and 15c of substantially the same size as the reduced openings 14a, 14b and 14c defined by the sidewalls shown in FIGS. 3a, 3b and 3c.

Figure 5:
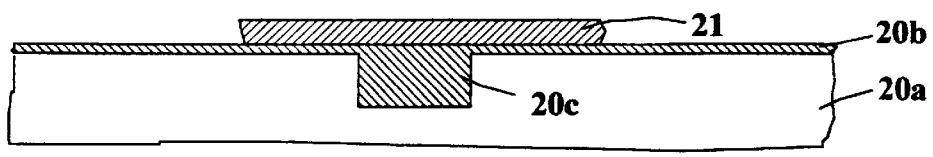
FIG. 5 is a cross-sectional view of a portion of a semiconductor substrate with an insulating layer and field oxide insolation and conductive line thereon.
Figure 6:
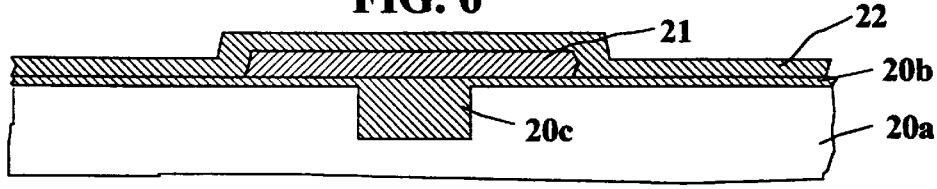
FIG. 6 is a cross-sectional view of the portion of the conductive line pattern of FIG. 5 with an etch protective layer thereon.
Figure 7:
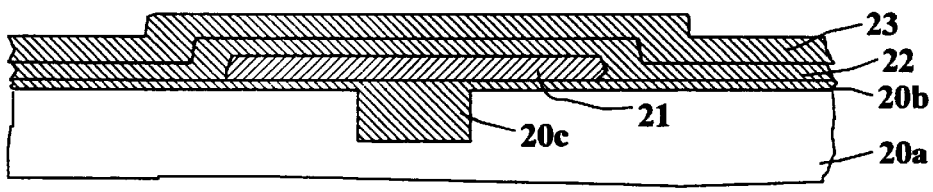
FIG. 7 is a cross-sectional view of the portion of the conductive line pattern of FIG. 6 with an insulating layer on the etch protective layer.
Figure 8:
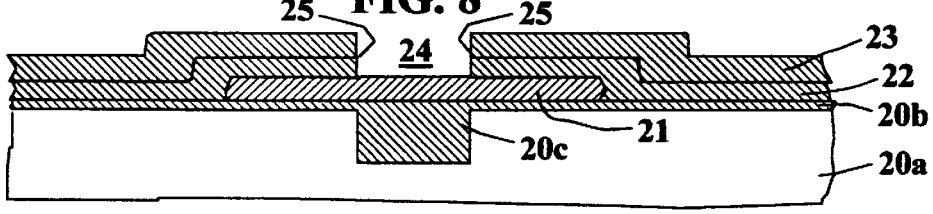
FIG. 8 is a cross-sectional view of the portion of the conductive line pattern of FIG. 7 with an opening in the insulating layer and etch protective layer formed by conventional optical lithography and etch.
Figure 9:
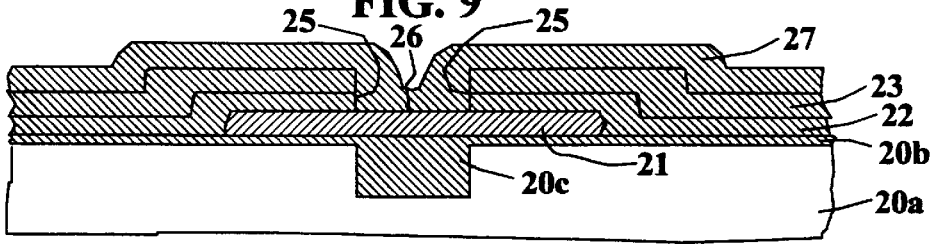
FIG. 9 is a cross-sectional view of the portion of the conductive line pattern of FIG. 8 with the opening filled with a conformal material.
Figure 10:
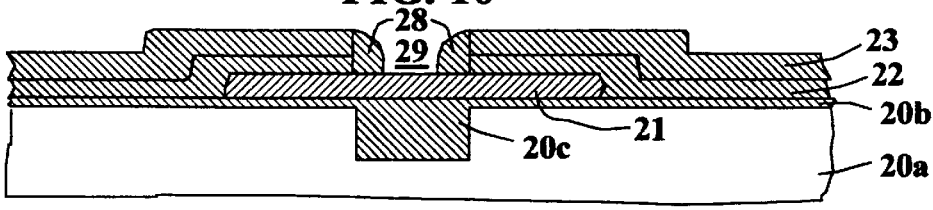
FIG. 10 is a cross-sectional view of the portion of the conductive line pattern of FIG. 9 with the conformal material anisotropically etched to form sidewalls in the opening and a reduced opening between the sidewalls.
Figure 11:
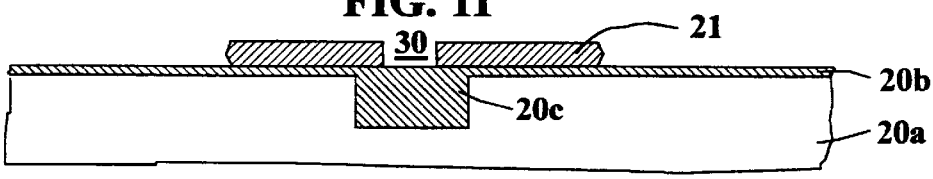
FIG. 11 is a cross-sectional view of the portion of the conductive line pattern of FIG. 10 with a gap or space formed in the conductive line of the size of the reduced opening between the sidewalls and with the insulating layer, etch protective layer and sidewalls removed.

Turning now to FIGS. 5–11 and a more detailed description of the present invention, FIG. 5 shows a portion of a semiconductor substrate 20, herein monocrystalline silicon with an insulating layer 20b and field oxide isolation 20c with a conductive line 21 disposed thereon. Intermediate layers (not shown) may be present between the surface of the semiconductor substrate 20a and the conductive line 21. Although the conductive line can be any of a number of conductive materials, the preferred material is polysilicon doped with an impurity to render it conductive, such as boron or arsenic. To protect the silicon surface, full oxide isolation areas, such as 20c, and any intermediate layers from subsequent etching, an etch protective layer 22 is preferably used. Herein silicon nitride, as shown in FIG. 6, serves as the etch protective layer and is formed on silicon surface and the conductive line pattern by chemical vapor deposition in the present instance, but other known methods, such as sputtering, may be used to form this layer 22. Next, an insulating layer 23, herein silicon oxide, which is shown in FIG. 7 as conformal, but also can be formed by nonconformal deposition, such as by chemical vapor deposition of silane ($SiH_4$) and oxygen. Another suitable material for the insulating layer 23 is fluorinated silicon oxide ($SiO_xF_y$). A conformal deposition may be performed by using tetraethylorthosilicate (TEOS) or tetramethylcyclosilonane (TMCTS). An opening 24 is formed with walls 25 in the etch protective layer 22 and the insulating layer 23 by using a conventional resist and optical lithographic exposure and development and, preferably, followed by anisotropic dry etching. The gas mixtures used in etching are more selective for the layers 22 and 23 than the conductive line 21 and herein, are carbon tetrafluoride with hydrogen ($CF_4/H_2$). Carbon hexafluoride ($C_2F_6$) also can be used to etch both silicon oxide and silicon nitride without etching polysilicon. Conventional etchers, such as a parallel plate reactive ion etcher (RIE), are suitable for forming the opening. Another suitable plasma reactor is an electron cyclotron resonance (ECR) plasma reactor. After the opening 24 is formed and extends to the upper surface 26 of the conductive line, a conformal material 27 is deposited on the insulating layer 23 and in the opening 24. Herein the conformal material is silicon oxide deposited using TEOS, but the conformal material may also be deposited using TMCTS. Since the material 27 is conformal, its deposition is essentially uniform on the top of the insulation layer 23, the sides of the walls 25, and on the surface 26 of the conductive line 21 as shown in FIG. 9. Again, anisotropic etching is used remove the conformal material 27 from the top of the insulating layer 23 and the bottom of opening 24 to the surface 26 of the conductive line. The same two fluorine gases described for etching silicon oxide and silicon nitride can be used to etch the conformal silicon oxide 27 without etching the polysilicon layer 21. Alternative gases, which are more selective for silicon oxide than polysilicon, are carbon octofluoride ($C_3F_8$) and carbon trifluoride ($CHF_3$). Because anisotropic etching is unidirectional, the vertical portion of the conformal material 27 in the opening 24 is not etched and sidewalls 28 are formed in the opening 24 reducing the size of the opening as shown in FIG. 10. The reduced opening (RO) 29 equals the original opening 24 minus the width of two sidewalls 28 (RO=W−2S). By using the sidewalls, which is one continuous sidewall around the periphery of the opening as shown in FIG. 3, as a mask for forming a gap or space in the conductive line, a minimal sized gap or space 30 is formed, which is smaller than the resolution limitation of optical lithography. Herein, the conductive line 21 is anisotropically etched using a gas which is more selective for the material, herein polysilicon, of the conductive line than the conformal material 27. Preferably, sulfur hexafluoride with chlorine or oxygen ($SF_6Cl$ or $SF_6/O_2$) is used but other gases with sufficient selectivity, such as silicon tetrafluoride with oxygen ($SiF_4/O_2$), can be substituted. After the etch protective layer 22, the insulating layer 23, and the sidewalls 28 are removed, the conductive line 21 remains with a gap or space 30 which is smaller than the original opening 24 as shown in FIGS. 4 and 11.

The major advantage that can be taken from the method of the present invention of reducing the dimension of gaps or spaces in conductive line patterns is a greater density in integrated circuits, especially microprocessor integrated circuits with large internal SRAMs. Further, such increased density is achieved with conventional semiconductor manufacturing tools. Thus, dimensions smaller that the resolution limits of optical lithography are achieved while still using optical lithography as one of the manufacturing tools in the method of the present invention.

Although this invention has been described relative to specific materials, and apparatuses for depositing and etching these materials, it is not limited to the specific materials or apparatuses but only to their specific characteristics. Other materials and apparatus can be substituted for those described herein which will be well understood by those skilled in the microelectronics and semiconductor arts after appreciating the present invention.

Having thus described the invention, what is claimed is:

1. In a method of fabricating a gap or space in a conductive line pattern of an integrated circuit, the method comprising the steps of:

forming the conductive line pattern, for interconnecting transistors in the integrated circuit, disposed on a semiconductor substrate;

forming an etch protective layer on said conductive line pattern;

forming an insulating layer on said etch protective layer;

forming, using optical lithography, an opening with vertical walls in said insulating layer to expose said conductive line pattern for creating an open in the conductive line pattern;

depositing, a conformal material on said insulating layer, on the vertical walls of said opening and on said exposed conductive line pattern;

forming sidewalls from the conformal material on the vertical walls of said opening to substantially reduce the opening to form a reduced opening by the addition of the sidewalls;

completely removing a portion of the conductive line pattern of about the same size as the reduced opening by using the sidewalls as a mask to from the gap or space in the conductive line pattern to serve as an open in the conductive line pattern, whereby the gap or space is smaller in dimension than the opening created by optical lithography; and maintaining the size of said gap or space in said conductive line pattern during the remaining fabrication of the conductive line pattern.

2. The method of claim 1 wherein the insulating material in which the opening formed by optical lithography comprises at least two opposing walls of the opening being spaced apart from each other by X dimension and, after the sidewalls each having a Y width dimension are formed and abut each of these opposing walls of the insulating material, the X dimension of the opening is reduced by two Y width dimensions of the sidewalls.

3. The method of claim 2 wherein the sidewalls surround the walls of the insulating layer forming the opening.

4. The method of claim 2 wherein the opening in the insulating material is an elongated rectangle and the reduced opening created by the sidewalls is an elongated slot.

5. The method of claim 2 wherein the opening in the insulating material is a square and the corners of the reduced opening created by the sidewalls are rounded.

6. The method of claim 2 wherein the opening in the insulating material is circular and the reduced opening created by the sidewalls is circular.

7. The method of claim 1 wherein the sidewalls are formed by anisotropic etching the conformal material.

8. The method of claim 1 wherein an etch protective layer is disposed between the conductive line pattern and the insulating layer.

9. The method of claim 1 wherein the conformal material is tetraethylorthosilicate.

10. The method of claim 1 wherein the reduced opening equals the lithographic opening minus the width of two opposing sidewalls.

11. A method of fabricating a gap or space in a conductive line pattern for connecting transistors in an integrated circuit comprising the steps of:

forming the conductive line pattern with a thickness, disposed on a semiconductor substrate and overlying and in contact with field oxide isolation in the substrate;

forming an etch protective layer on said conductive pattern;

forming an insulating layer on said each protective layer;

forming an opening in said insulating layer over said field oxide isolation using optical lithography;

depositing a conformal material on said insulating layer and in said opening;

forming sidewalls of the conformal material in said opening with a reduced opening between the sidewalls; and removing completely through its thickness a portion of the conductive line pattern of about the same size as the reduced opening by using the sidewalls as a mask and said field oxide isolation as an etch stop to from the gap or space in the conductive line pattern over the field oxide isolation, whereby the gap or space is smaller in dimension than the opening created by optical lithography.

12. The method of claim 11 wherein the etch protective layer, the insulating layer and sidewalls are removed after forming the gap or space in the conductive line pattern.

* * * * *